(12) United States Patent
Casier et al.

(10) Patent No.: US 6,937,720 B2
(45) Date of Patent: Aug. 30, 2005

(54) XDSL CLASS C-AB DRIVER

(75) Inventors: Herman Joris Casier, Kuurne (BE); Joannes Mathilda Josephus Sevenhans, Brasschaat (BE); Elvé Desiderius Jozef Moons, Lummen (BE)

(73) Assignee: Alcatel, Paris (FR)

( * ) Notice: Subject to any disclaimer, the term of this patent is extended or adjusted under 35 U.S.C. 154(b) by 568 days.

(21) Appl. No.: 10/026,435

(22) Filed: Dec. 27, 2001

(65) Prior Publication Data

US 2002/0084811 A1 Jul. 4, 2002

(30) Foreign Application Priority Data

Dec. 28, 2000 (EP) .......................................... 00403694

(51) Int. Cl.⁷ .......................................... H04M 11/06
(52) U.S. Cl. .......................... 379/399.01; 341/399.01; 332/176
(58) Field of Search ................. 379/399.01–399.02; 330/110, 183; 341/140; 332/176; 327/341, 334

(56) References Cited

U.S. PATENT DOCUMENTS

| | | |
|---|---|---|
| 3,763,437 A | 10/1973 | Seidel |
| 3,815,040 A | 6/1974 | Seidel |
| 3,873,936 A | 3/1975 | Cho |
| 5,930,128 A | 7/1999 | Dent |
| 6,075,411 A * | 6/2000 | Briffa et al. ................. 330/149 |

FOREIGN PATENT DOCUMENTS

EP   0 901 221 A1   3/1999

OTHER PUBLICATIONS

R.D. Stewart et al., "Feedforward Linearisation of 950 MHz Amplifiers", IEEE Proceedings, vol. 135, PT. H., No. 5, Oct. 1998, p 347–350.*

Hans Ertl et al.: "Basic Considerations and Topologies of Switched–Mode Assisted Linear Power Amplifiers" IEEE Transactions on Industrial Electronics, Feb. 1997, pp. 116–123vol. 44, No. 1.

Nam–Sung Jung, et al.: "A New High–Efficiency and Super–Fidelity Analog Audio Amplifier with the aid of Digital Switching Amplifier: Class K Amplifier", Department of Electrical Engineering, Korea Advanced Institute of Science and Technology, IEEE Publication, 1998.

* cited by examiner

Primary Examiner—Sinh Tran
Assistant Examiner—Daniel Swerdlow
(74) Attorney, Agent, or Firm—Sughrue Mion, PLLC

(57) ABSTRACT

A line driver having a non-linear amplifier that is arranged to provide a first output signal, which is an amplified input signal. The line driver also includes an analog linear amplifier providing a second output signal based on the difference between the input signal and the first output signal, placed in parallel with the non-linear amplifier. The line driver also includes a device to combine the first output signal and the second output signal to provide a total output signal to an output line.

15 Claims, 3 Drawing Sheets

US 6,937,720 B2

XDSL CLASS C-AB DRIVER

FIELD OF THE INVENTION

The present invention is related to a novel line driver for applications such as ADSL (Asymmetric Digital Subscriber Line) or VDSL (Very High Speed Digital Subscriber Line).

STATE OF THE ART

In the design of line drivers for applications such as ADSL (Asymmetric Digital Subscriber Line) or VDSL (Very High Speed Digital Subscriber Line), power consumption is a critical issue and signal linearity requirements are stringent. Manufacturers are continually looking for solutions to decrease power consumption. At the moment, the DSL chip market is estimated at 50 million chip sets for 2000 (total value of more than 1 billion USD in 2000).

A traditional class G driver consumes about 1.3 Watt to produce an output signal of 100 mWatt. The power consumption of the class G driver may be reduced by about 100 mWatt/$\eta$ (where $\eta$ is the efficiency of the amplifier which typically has a value between 0.05 and 0.10) through use of an active back termination. Such an active back terminated line driver is described in EP-A-0901221.

A class 0 driver can also be used, including switches and circuitry to monitor the crest factor of the transmitted signal and to appropriately switch between two power supply levels.

A traditional switch mode driver (SW-DRIVER), which consists of a $\Sigma\Delta$-modulator ($\Sigma\Delta$), circuitry (SW) to monitor the crest factor of the transmitted signal and to appropriately switch between different power supply levels, a low pass filter (Fl) and a hybrid (HY), less power as digital technology proceeds to deeper submicron technologies. Such a switch mode driver for instance is shown in FIG. 1*b* of "Basic considerations and topologies of switched-mode assisted linear power amplifiers", IEEE transactions on Industrial Electronics, Vol. 44 No.1 pp 116–123, February 1997. Power consumption is optimized through switching between the different power supply levels. In an improved version of the switch mode driver (SW-DRIVER), the crest factor is monitored in the hybrid (HY). In this way, power consumption is further optimized. The power consumption may even be further reduced by about 100 mWatt/$\eta$ ($\eta$ being the efficiency of the amplifier) through use of active back termination.

A switch mode amplifier (digital amp.) in parallel with a linear amplifier (analog amp.) each producing part of an outputted audio signal is disclosed in FIG. 4 of "A New High-Efficiency and Super-Fidelity Analog Audio Amplifier with the aid of Digital Switching Amplifier: Class K Amplifier",(IEEE publication, Nam-Sung Jung, Nam-In Kim & Gyu-Hyeong Cho, 1998). In the class K amplifier, the linear amplifier (analog amp.) is an independent source, whereas the switch mode amplifier (digital amp.) is controlled by the voltage sensed over the resistor Rsense and consequently is dependent on the current source by the linear amplifier (analog amp.). Also FIG. 2 of "Basic considerations and topologies of switched-mode assisted linear power amplifiers", IEEE transactions on Industrial Electronics, Vol. 44 No.1 pp 116–123, February 1997 and FIG. 3 of "A Design of a 10-W Single-Chip Class D audio amplifier with Very High Efficiency using CMOS Technology", IEEE Transactions on Consumer Electronics, Vol. 45, No. 3, pp 465–473, August 1999 show switched-mode assisted linear amplifiers with a structure and functionality similar to that of the class K amplifier of "A New High-Efficiency and Super-Fidelity Analog Audio Amplifier with the aid of Digital Switching Amplifier: Class K Amplifier", already cited above.

The switching mode line driver (SW-DRIVER) is the most power efficient line driver, but is very sensitive for power supply variations (low power supply rejection) and clock jitter. This results in errors in the transmitted signal.

AIMS OF THE INVENTION

The present invention aims to provide a novel line driver which is linear, stable, and efficient. The output of said driver should be free of errors due to power supply variations and clock jitter.

SUMMARY OF THE INVENTION

The present invention concerns a line driver for amplifying an input signal, said line driver comprising:
- a non-linear amplifier arranged to provide a first output signal amplifying said input signal
- an analogue linear amplifier providing a second output signal based on the difference between the input signal and the first output signal, placed in parallel with said non-linear amplifier and being dependent thereon, and
- combining means arranged to combine said first output signal and said second output signal to provide a total output signal to an output line.

The present invention equally concerns a line driver for amplifying an input signal, said line driver comprising:
- a first input terminal for receiving said input signal,
- a non-linear amplifier connected to said input terminal and arranged to provide a first output signal at a first output terminal,
- an analogue linear amplifier comprising a second and a third input terminal and a second output terminal, set up as a comparator between said input signal and said first output signal and arranged to provide a second output signal at said second output terminal, and
- combining means arranged to combine said first output signal and said second output signal to provide a total output signal to an output line.

In a line driver according to the present invention, the proportion of the first output signal in the total output signal is preferably at least 95%.

The line driver of the invention can comprise a digital to analogue converter arranged to convert the input signal to an analogue input signal and that said analogue input signal is fed to the second input terminal of the linear amplifier.

Preferably, the linear amplifier is selected from the group consisting of class A and class A/B amplifiers, and the non-linear amplifier is preferably selected from the group consisting of switching mode amplifiers, clipping amplifiers, class B, G or K amplifiers and pulse width modulation amplifiers.

The combining means can comprise e.g. a hybrid. The input signal can be generated by a DMT.

In an advantageous embodiment of the present invention, the line driver further comprises an active back termination circuit.

A second aspect of the present invention is A analogue-digital combined amplifier comprising:
- a non-linear digital amplifier serving as an independent current source
- an analogue linear amplifier serving as a voltage source dependent on said non-linear digital amplifier, wherein the output of said analogue-digital combined amplifier is a combination of the output of said non-linear digital amplifier and said analogue linear amplifier.

Also in this aspect, the linear amplifier can be selected from the group consisting of class A and class A/B amplifiers, and the non-linear amplifier is preferably selected from the group consisting of switching mode amplifiers, clipping amplifiers, class B, G or K amplifiers and pulse width modulation amplifiers.

Another aspect of the present invention is a method for amplifying an input signal, comprising the following steps:

providing a line driver according to the present invention, feeding said line driver at the input terminal with said input signal, a first amplifying step, comprising amplifying said input signal with the non-linear amplifier and providing the first output signal at the first output terminal, a second amplifying step, performed in parallel with said first amplifying step and comprising a digital to analogue conversion of the input signal to an analogue input signal, and comparing said analogue input signal with said first output signal using an analogue linear amplifier, providing a second output signal at the second output terminal, and a combination step comprising combining said first output signal with said second output signal to obtain a total output signal to an output line.

Said combination step can be performed using a hybrid, and the input signal can be generated by a DMT.

SHORT DESCRIPTION OF THE DRAWINGS

Figure 3:
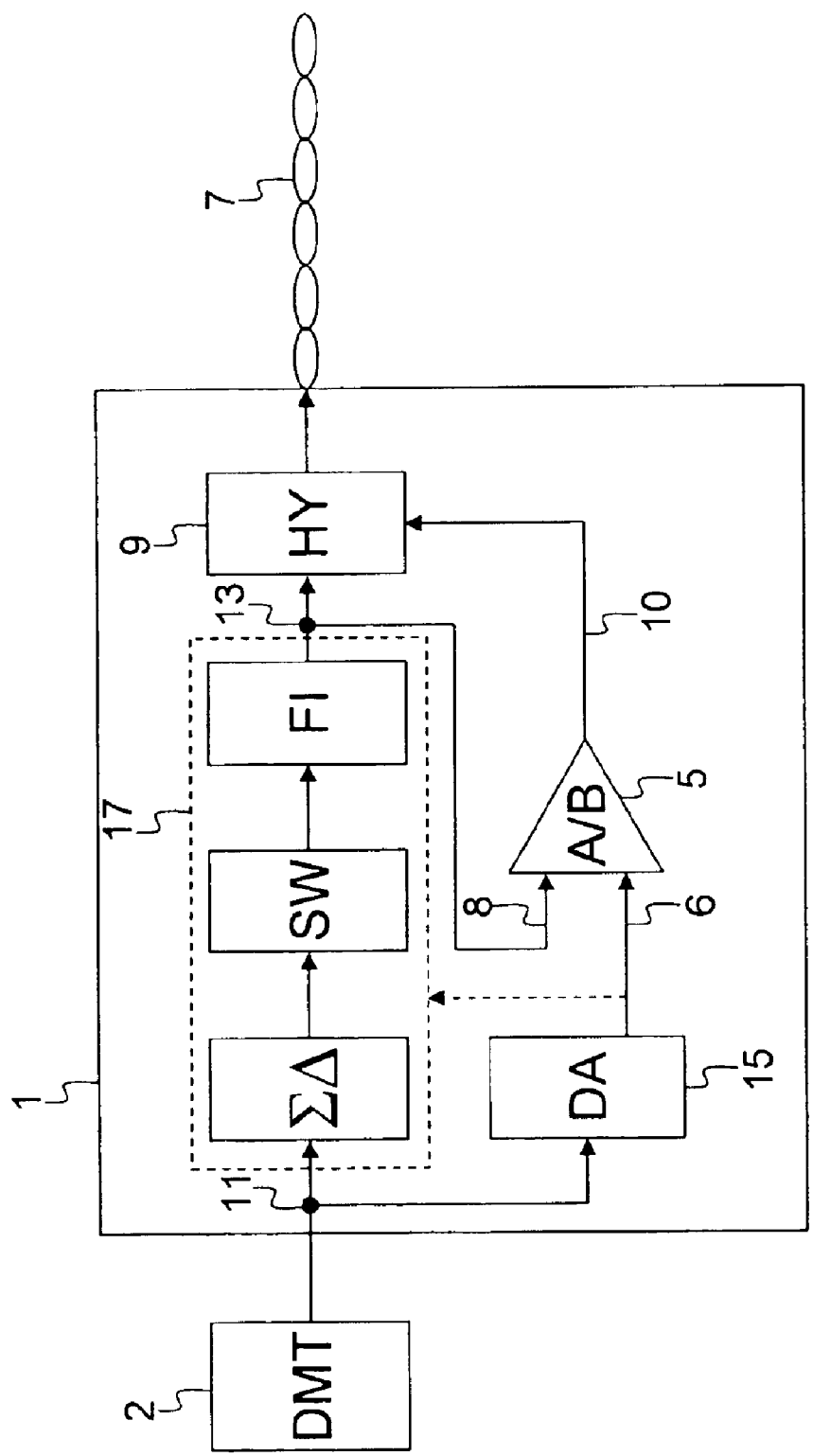

FIG. 3 draws a Class C-AB driver according to a preferred embodiment of the present invention.

DETAILED DESCRIPTION OF THE INVENTION

The present invention describes a novel line driver, called C-AB driver. It comprises at least an analogue linear amplifier, coupled in parallel with a non-linear line driver and producing only a small part of the output signal power, and can compensate for the errors in the output signal from the non-linear line driver due to power supply variations and clock jitter.

Figure 2:
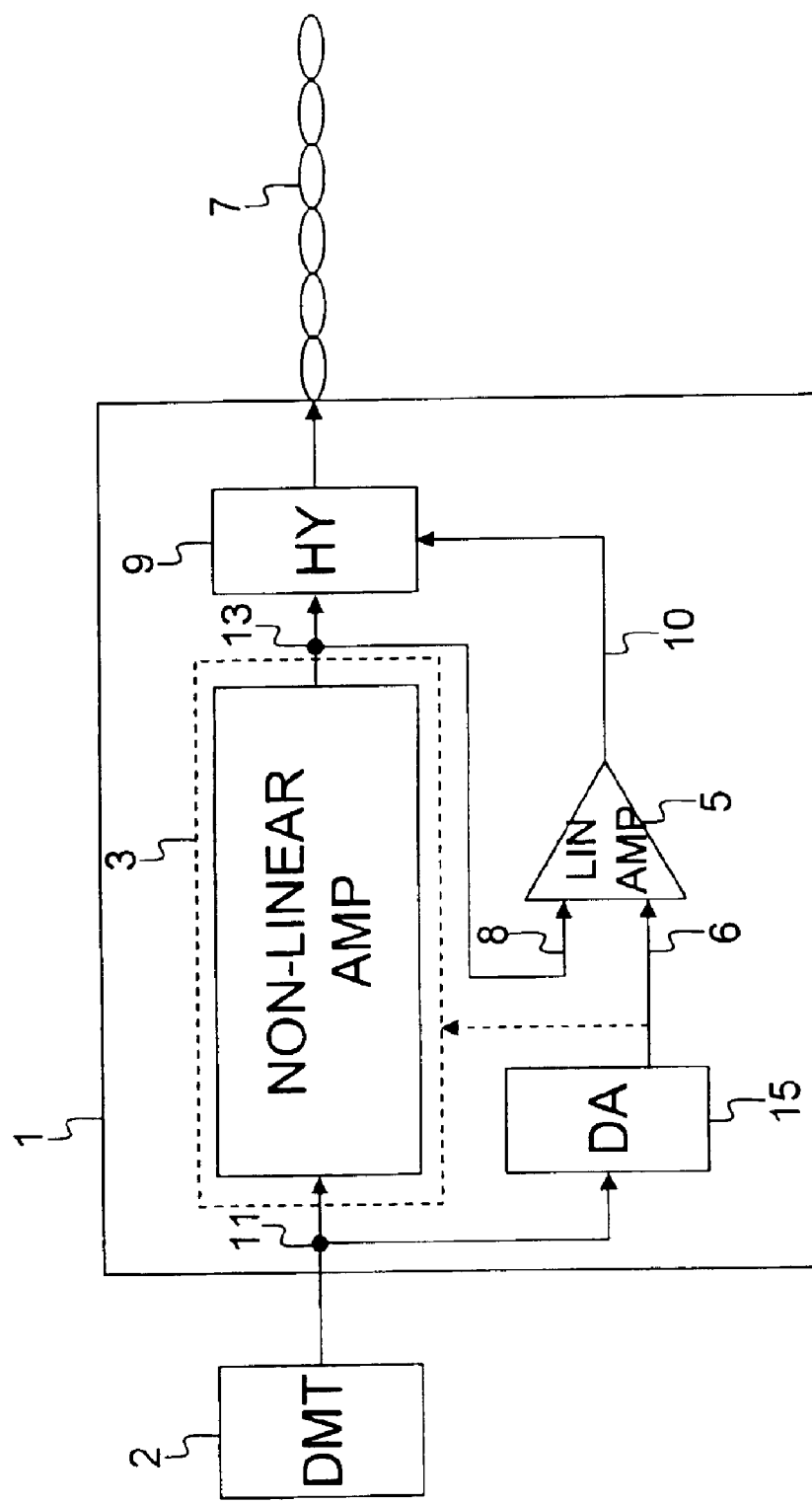
FIG. 2 represents a Class C-AB driver according to the present invention.

An example of a class C-AB driver according to the present invention can be seen in FIG. 2.

The class C-AB driver 1 comprises a nonlinear amplifier 3, being the independent source, and further comprises an analogue linear amplifier 5 which is controlled to compensate for the non linearity of the non-linear amplifier 3 and thus is dependent.

According to the present invention, the analogue linear amplifier 5 compares the input signal 11 as sent by the DMT 2 and converted digital to analogue by D/A converter 15 with the output signal 13 at the output of the non-linear amplifier 3. The difference between these signals is compensated for by the analogue linear amplifier 5 and the output of both the non-linear amplifier 3 and the analogue linear amplifier 5 are combined by hybrid 9 and sent on line 7.

The non-linear amplifier can be any non-linear amplifier. Examples are clipping amplifiers, switching mode amplifiers, class K, G or B amplifiers, pulse width modulators, . . . . The analogue linear amplifier can be any analogue linear amplifier, such as a class A or class A/B amplifier.

A 3'rd order/4'th order RC or LC filter (Fl) is required to limit the band to 1 Mhz if a switching mode driver is used as the non-linear amplifiers.

It is clear that the set-up of the present invention can be combined with other power-saving techniques, such as active back termination.

DESCRIPTION OF A PREFERRED EMBODIMENT OF THE INVENTION

In FIG. 3, one can see a class C-AB line driver 1 according to a preferred embodiment of the present invention, containing a traditional switch mode line driver 17 (with a $\Sigma\Delta$-modulator ($\Sigma\Delta$) 19, circuitry (SW) 21 to switch between different power supply levels, and a low pass filter (Fl) 23) that produces about 95% of the required output signal power. Such a switch mode line driver 17 can be seen in FIG. 1.

According to this embodiment, as can be seen in FIG. 3, the class C-AB line driver 1 contains, in parallel with the switch mode line driver 17, a class AB amplifier 5 that produces about 5% of the required output signal power. This class AB amplifier 5 thereto compares the signal at the output 13 of the switch mode line driver 17 with the digital to analog converted (15) input signal 11 of the class C-AB line driver 1. The difference between these two signals is compensated for by the class AB amplifier 5. Again, a hybrid (HY) 9 combines the signals produced by the switch mode line driver 17 and the class AB amplifier 5.

Figure 1:
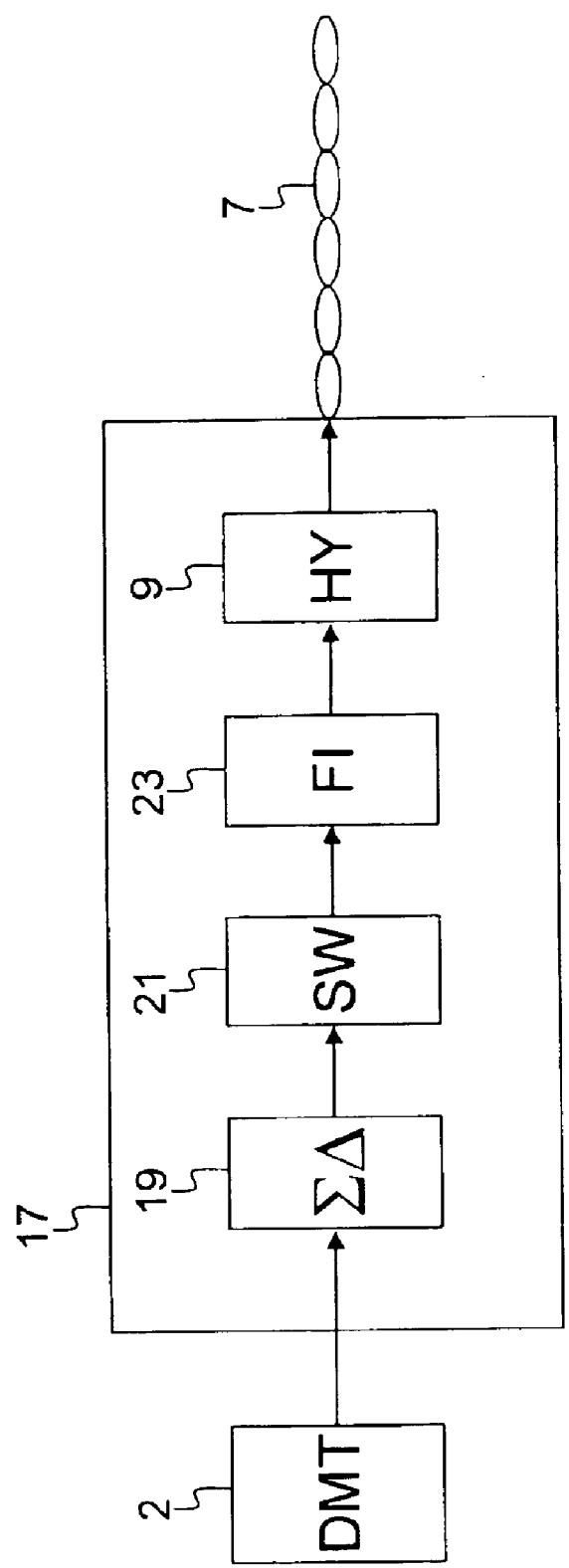
FIG. 1 shows a switching mode line driver as known from the prior art.

The distortion due to power supply changes and clock jitter in this embodiment is reduced by a factor 5 to 8 in comparison with the traditional switching mode line driver as in FIG. 1.

An additional advantage with the class C-AB line driver according to the invention is that power supply can be simplified compared to the traditional G-class amplifier. A class G amplifier needs GND (ground), +Vcc, +Vcc/2, −Vcc and −Vcc/2 potentials. The non-linear and linear amplifier of the class C-AB line driver according to the invention only need +Vcc, −Vcc and GND connections. DC-de-coupling capacitors, inserted at the output of the non-linear amplifier are useful to avoid power supply asymmetry effects when driving the line with two non-linear amplifiers.

What is claimed is:

1. A line driver for amplifying an input signal, said line driver comprising:

a digital non-linear amplifier arranged to provide a first output signal amplifying said input signal, a digital to analog converter that converts the input signal into an analog input signal, an analog linear amplifier providing a second output signal based on the difference between the analog input signal and the first output signal, and placed in parallel with said non-linear amplifier, and combining means arranged to combine said first output signal and said second output signal to provide a total output signal to an output line.

2. The line driver as in claim 1, further comprising an active back termination circuit.

3. The line driver as in claim 1, wherein a proportion of the first output signal in the total output signal is at least 95%.

4. The line driver as in claim 1, wherein said analog input signal is fed to an input terminal of the linear amplifier.

5. The line driver as in claim 1, wherein the linear amplifier is selected from the group consisting of class A and class A/B amplifiers.

6. The line driver as in claim 1, wherein the non-linear amplifier is selected from the group consisting of switching mode amplifiers, clipping amplifiers, class B, G or K amplifiers and pulse width modulation amplifiers.

7. The line driver as in claim 1, wherein the combining means compose a hybrid.

8. The line driver as in claim 1, wherein the input signal is generated by a DMT.

9. A line driver for amplifying an input signal, said line driver comprising:
- a first input terminal for receiving said input signal,
- a digital non-linear amplifier connected to said input terminal and arranged to provide a first output signal at a first output terminal,
- a digital to analog converter connected to said input terminal and arranged to provide an analog output signal,
- an analog linear amplifier comprising a second and a third input terminal and a second output terminal, set up as a comparator between said analog input signal and said first output signal and arranged to provide a second output signal at said second output terminal, and
- combining means arranged to combine said first output signal and said second output signal to provide a total output signal to an output line.

10. An analog digital combined amplifier comprising:
- a non-linear digital amplifier receiving an input signal and serving as an independent current source,
- a digital to analog converter receiving said input signal and outputting an analog input signal, and
- an analog linear amplifier serving as a voltage source dependent on said non-linear digital amplifier and said analog input signal,
- wherein the output of said analog digital combined amplifier is a combination of the output of said non-linear digital amplifier and said analog linear amplifier.

11. The analog digital combined amplifier as in claim 10, wherein the linear amplifier is selected from the group consisting of class A and class A/B amplifiers.

12. The analog digital combined amplifier as in claim 10, wherein the non-linear amplifier is selected from the group consisting of switching mode amplifiers, clipping amplifiers, class B, G or K amplifiers and pulse width modulation amplifiers.

13. A method for amplifying an input signal, wherein the method comprises:
- amplifying said input signal with a digital non-linear amplifier and providing a first output signal at a first output terminal,
- performing a digital to analog conversion of the input signal to an analog input signal in parallel with the amplifying of the input signal with said digital non-linear amplifier, and comparing said analog input signal with said first output signal using an analog linear amplifier, and providing a second output signal at a second output terminal, and
- combining said first output signal with said second output signal to obtain a total output signal to an output line.

14. The method as in claim 13, wherein the combining of said first output signal with said second output signal is performed using a hybrid.

15. The method as in claim 13, wherein the input signal is generated by a DMT.

* * * * *